(12) United States Patent
Furukawa et al.

(10) Patent No.: US 9,117,724 B2
(45) Date of Patent: Aug. 25, 2015

(54) SOLID-STATE IMAGE SENSING DEVICE

(71) Applicant: Hitachi, Ltd., Chiyoda-ku, Tokyo (JP)

(72) Inventors: Tomoyasu Furukawa, Ome (JP); Tomohiro Saito, Tachikawa (JP); Yusuke Nonaka, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/662,413

(22) Filed: Mar. 19, 2015

(65) Prior Publication Data

US 2015/0194458 A1     Jul. 9, 2015

Related U.S. Application Data

(63) Continuation of application No. 13/749,673, filed on Jan. 24, 2013, now abandoned.

(30) Foreign Application Priority Data

Feb. 21, 2012   (JP) .................................. 2012-034634

(51) Int. Cl.
*H01L 27/146*   (2006.01)
*H01L 29/78*    (2006.01)

(52) U.S. Cl.
CPC .... *H01L 27/14643* (2013.01); *H01L 27/14603* (2013.01); *H01L 29/7816* (2013.01)

(58) Field of Classification Search
CPC .......................... H04N 3/155; H01L 27/14643
See application file for complete search history.

(56) References Cited

U.S. PATENT DOCUMENTS

| | | | | |
|---|---|---|---|---|
| 5,900,623 A * | 5/1999 | Tsang et al. | ............... | 250/208.1 |
| 5,939,742 A * | 8/1999 | Yiannoulos | ................... | 257/292 |
| 7,211,779 B2 * | 5/2007 | Galambos et al. | ......... | 250/208.1 |
| 8,076,702 B2 * | 12/2011 | Lim | ............................... | 257/288 |
| 8,643,132 B2 * | 2/2014 | Chen et al. | .................... | 257/461 |
| 8,729,451 B2 * | 5/2014 | Bikumandla | ............. | 250/214 R |
| 2002/0000508 A1 * | 1/2002 | Muramatsu et al. | ........ | 250/208.1 |
| 2004/0251396 A1 * | 12/2004 | Koyama | ..................... | 250/208.1 |
| 2012/0145883 A1 * | 6/2012 | Liu | ............................ | 250/208.1 |
| 2012/0218451 A1 * | 8/2012 | Rajasekaran | ................ | 348/302 |
| 2012/0286139 A1 * | 11/2012 | Tashiro et al. | ............. | 250/208.1 |
| 2012/0313197 A1 * | 12/2012 | Chen et al. | .................... | 257/431 |
| 2015/0145611 A1 * | 5/2015 | Ito et al. | ................. | H03B 5/366 |
| 2015/0146060 A1 * | 5/2015 | Suzuki et al. | ........ | H04N 5/3745 |

FOREIGN PATENT DOCUMENTS

JP   2006-148284 A   6/2006

* cited by examiner

*Primary Examiner* — Roberto Velez
*Assistant Examiner* — Cynthia Segura
(74) *Attorney, Agent, or Firm* — Miles & Stockbridge P.C.

(57) ABSTRACT

A solid-state image sensing device is configured such that a first voltage is applied to a first conductivity type semiconductor region and a second voltage is applied to source-drain regions having a second conductivity type of the MOS capacitance to apply inverse bias between the semiconductor region and the source-drain regions of the MOS capacitance.

3 Claims, 7 Drawing Sheets

SOLID-STATE IMAGE SENSING DEVICE

CLAIM OF PRIORITY

The present application claims priority from Japanese patent application JP 2012-034634 filed on Feb. 21, 2012, the content of which is hereby incorporated by reference into this application.

FIELD OF THE INVENTION

The present invention relates to a solid-state image sensing device such as a CMOS sensor, a CCD sensor, and the like which acquires images and positional information by using a photoelectric conversion effect, and particularly, to a technology of improvement of an SN ratio and extension of a dynamic range of a solid-state image sensing device, which includes MOS capacitance in a unit pixel and performs electric charge-to-voltage conversion.

BACKGROUND OF THE INVENTION

Solid-state image sensing devices represented as a CMOS sensor and a CCD sensor have been widely applied in a video camera or a digital still camera.

In the solid-state image sensing device using the CMOS sensor, as a photoelectric conversion element (PD) and a switching element performing the selection or a switching element reading a signal charge, CMOS transistors are used. Further, a MOS transistor or the CMOS transistor is used as peripheral circuits such as a control circuit, a signal processing circuit, and the like, and the photoelectric conversion element (PD), the switching elements, and the peripheral circuits may be manufactured on the same chip as a series of configurations.

The solid-state image sensing device, in which a plurality of pixels where photoelectric conversion elements (photodiode: PD) are provided are arranged on a semiconductor substrate, performs photoelectric conversion of light incident on each pixel by using the photodiodes to generate and collect electric charges, transmits the electric charges to a floating diffusion (FD) unit, detects potential variation in the FD unit by a MOS transistor, and converts and amplifies the detected potential variation into an electric signal, which is output as a video signal (for example, Japanese Unexamined Patent Application Publication No. 2006-148284).

SUMMARY OF THE INVENTION

In order to improve optical sensitivity of a video signal, it is preferable that capacitance of the FD unit is suppressed to be small and electric charge-to-voltage conversion efficiency at the time of converting a signal charge into signal voltage is set to be high. When the electric charges acquired by photoelectric conversion, the capacitance of the FD unit accumulating the electric charges, and the signal voltage of the FD unit are represented by Q, C, and V, a relationship of $\Delta V = \Delta Q/C$ is established, and thus a variation in signal voltage V accompanied by a variation in electric charges Q is larger as the capacitance C is smaller. However, as described above, when the electric charge-to-voltage conversion efficiency is increased, imaging sensitivity is increased, and as a result, an SN ratio is decreased due to a noise component caused by dark electric charges. Herein, the dark electric charges indicate electric charges which are generated by a cause other than incidence of light and are primarily caused by heat noise. Meanwhile, in order to suppress the capacitance of the FD unit to be small, when strong light is incident, all of the signal charges accumulated in the PD cannot be transmitted to the FD unit. Further, as a countermeasure, when decreasing a saturated signal amount of the PD, a contrast of a part having high luminance cannot be secured and a dynamic range is reduced. By increasing the capacitance of the FD unit, when the dynamic range is widened by expansion of a dimension of the PD, dark current is increased in proportion to the PD dimension. As a result, in order to simultaneously implement the improvement of the SN ratio and the extension of the dynamic range, the generation of the dark electric charges needs to be suppressed.

Inverse bias is applied to the PN junction in the solid-state image sensing device which is in operation, and as a result, a plurality of carriers which is present on a diffusion layer overcomes a potential barrier of a well and is introduced into the PD to prevent the dark electric charges from being increased.

Alternatively, when the element of the electric charge-to-voltage conversion unit is configured by an element including the MOS capacitance, the element is configured by the enhancement type MOS capacitance having the same conductivity type of the well to prevent the dark electric charges from being increased due to introduction into the PD and reduce a layout dimension because a wiring for connecting a diffusion layer of the MOS capacitance need not be arranged.

The improvement of the SN ratio and the extension of the dynamic range of the solid-state image sensing device may be simultaneously implemented.

DETAILED DESCRIPTION OF THE PREFERRED EMBODIMENTS

First Embodiment

Hereinafter, embodiments of the present invention will be described in detail with reference to the accompanying drawings.

Figure 1:
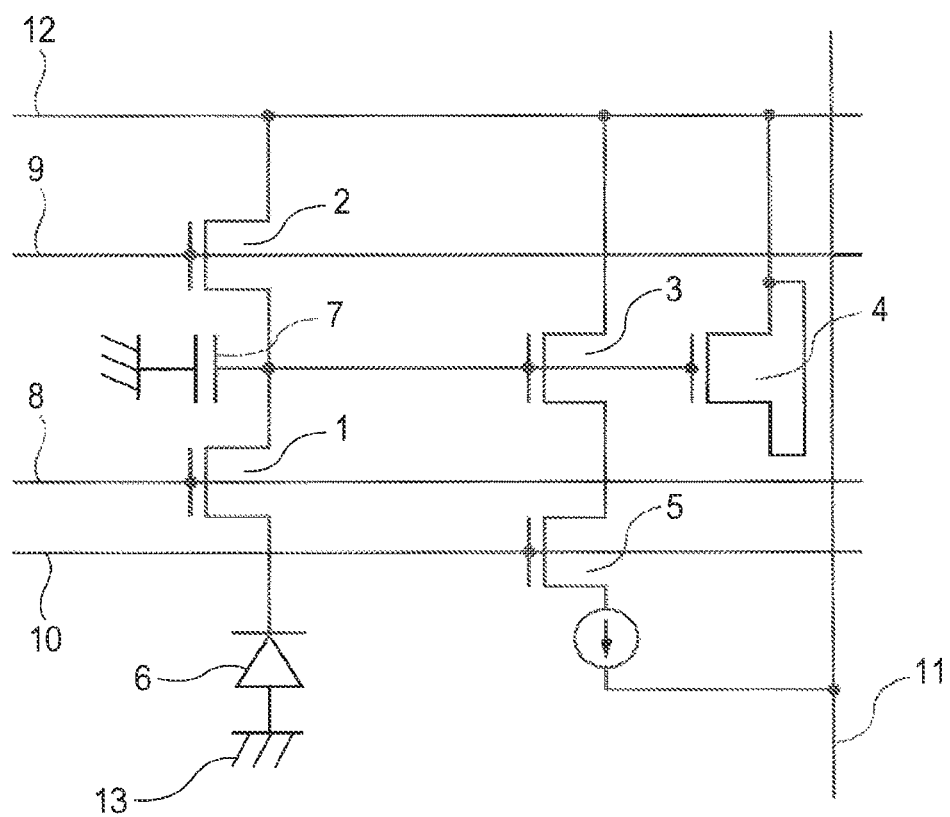
FIG. 1 is a pixel circuit configuration diagram of a solid-state image sensing device in a first embodiment.
Figure 2:
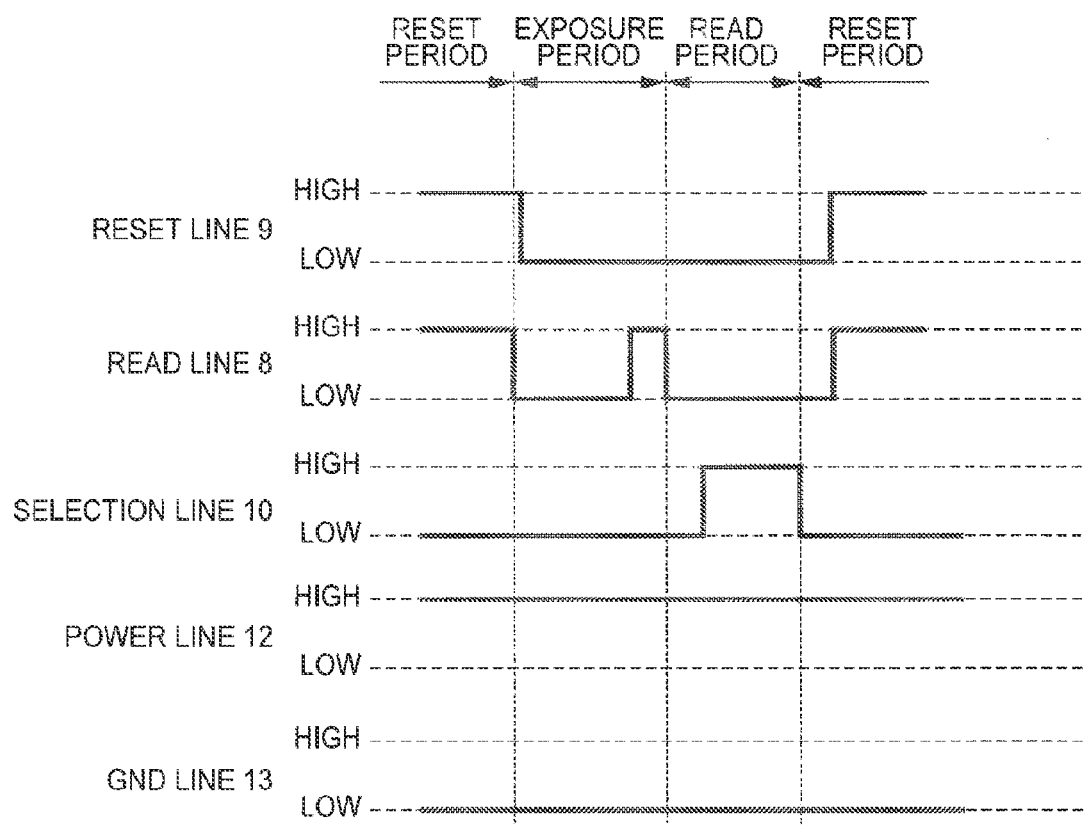
FIG. 2 is an operating time chart diagram of a CMOS image sensor.

FIG. 1 illustrates a circuit diagram of a CMOS image sensor (pixel unit) when an element of an electric charge-to-voltage conversion unit is configured by an element including MOS capacitance. A circuit configuration of the pixel unit including the MOS capacitance is disclosed in, for example, Japanese Unexamined Patent Application Publication No. 2006-148284. Further, this circuit is one example and is not limited to the circuit configuration. An operation of this circuit will be described by using a time chart of FIG. 2.

During a reset period, a reset line 9 and a read line 8 are high, a reset MOS 2 and a transfer MOS 1 are conducted, and as a result, electric charges of a photodiode PD6 and a floating diffusion FD7 are drawn. Thereafter, the reset line 9 and the read line 8 are low, and the reset MOS 2 and the transfer MOS 1 are not conducted. During an exposure period, photoelectric charges generated by irradiation of light are accumulated in the photodiode PD6. Subsequently, the read line 8 is high and the transfer MOS 1 is conducted to transmit the electric charges accumulated in the photodiode PD6 to the floating diffusion FD7 and the MOS capacitance 4. The floating diffusion FD7 serves as a capacitor, and the floating diffusion FD7 and the MOS capacitance 4 accumulate the electric charges depending on a light irradiation level to the photodiode PD6. During a read period, a selection line 10 is high and a select MOS 5 is conducted. A constant current source is connected to an amplifier MOS 3, and constant current flows between a source and a drain. Further, since a gate electrode of the amplifier MOS 3 is connected to the floating diffusion FD7 and the MOS capacitance 4, gate voltage depending on an accumulated charge quantity is applied to the amplifier MOS 3 and a potential depending on the accumulated charge quantity is shown at the source of the amplifier MOS 3. This output is read to a signal line 11 through the select MOS 5 as pixel information. After reading, the reset MOS 2 and the transfer MOS 1 are conducted again, and the electric charges accumulated in the photodiode PD 6 and the floating diffusion FD7 are reset to be provided in subsequent exposure.

Herein, the MOS capacitance 4 in parallel connected to the amplifier MOS 3 is additional capacitance for fully transmitting signal charges accumulated in the photodiode PD6 when strong light is incident. When electric charges generated by photoelectric conversion in the photodiode PD, gate capacitance of the amplifier MOS 3, capacitance of the floating diffusion 7, and capacitance of the MOS capacitance 4 are represented by $\Delta Q$, C1, C2, and C3, voltage variation $\Delta V$ by $\Delta Q$ may be expressed by a relationship of $\Delta V=\Delta Q/(C1+C2+C3)$.

Figure 3:
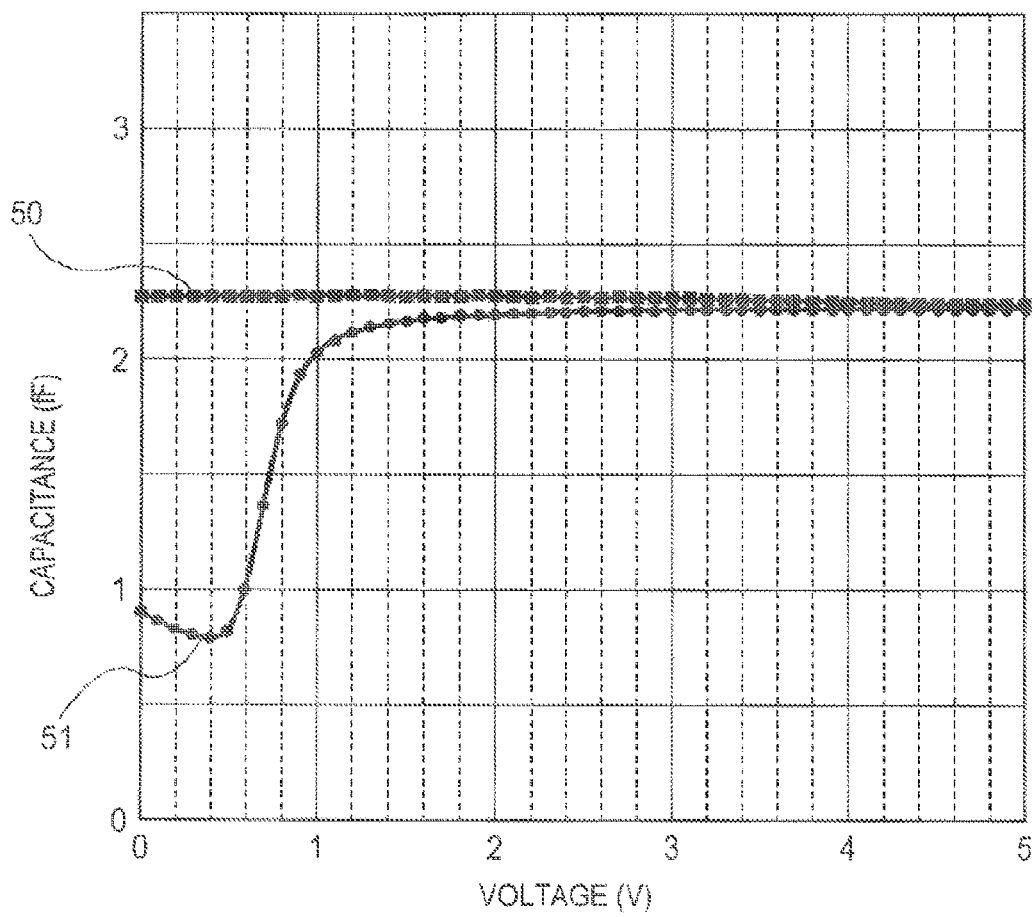
FIG. 3 is a capacitance characteristic diagram of an element including MOS capacitance.
Figure 4:
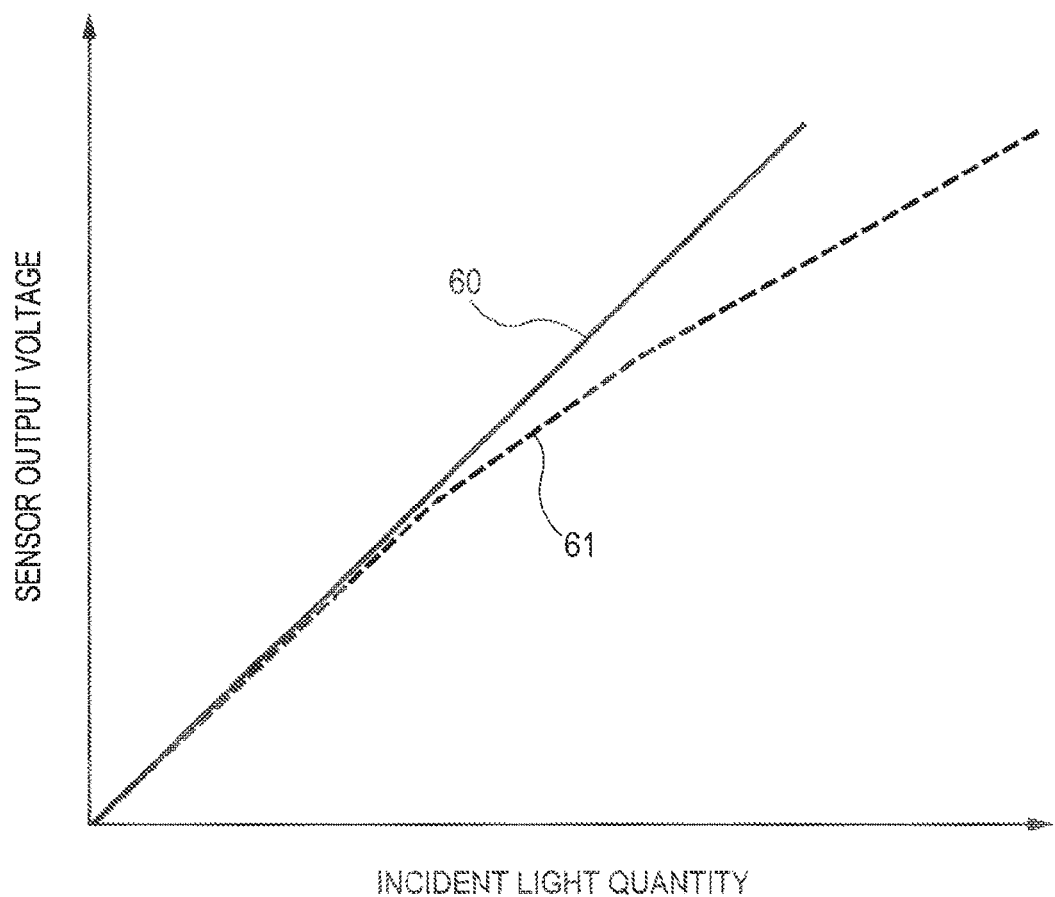
FIG. 4 is an output characteristic diagram of the CMOS image sensor.

FIG. 3 illustrates voltage dependency of capacitance of MOS capacitance. A horizontal axis indicates voltage applied to the capacitance and a vertical axis indicates the capacitance. When the MOS capacitance 4 which becomes the additional capacitance exclusively uses the structure of a general MOS transistor, the voltage dependency of the capacitance is shown as a range of operating voltage (for example, 3.3 V) of the pixel, as illustrated in a waveform 51. As a result, linearity of an output characteristic of a CMOS sensor deteriorates as illustrated in FIG. 4. When there is no voltage dependency, sensor output voltage is in proportion to an incident light amount as illustrated in a waveform 60, while nonlinearity is shown in the sensor output voltage for the incident light amount, as illustrated in a waveform 61, by the voltage dependency. Therefore, in order to decrease the voltage dependency of the capacitance, when the MOS capacitance 4 is a depression type (D type), a depression type (D type) MOS capacitance having threshold voltage (for example, −50 V) which is lower than a range of operating voltage is used, or when the MOS capacitance 4 is an enhancement type, an enhancement type (E type) MOS capacitance having threshold voltage (for example, 50 V) which is higher than the range of the operating voltage is used. That is, in the case of the depression type, the MOS capacitance operates in an accumulation region of the MOS transistor, and in the case of the enhancement type (E type), the MOS capacitance operates in a saturation region. In this embodiment, an example using the D type MOS capacitance will be described. In particular, a source and a drain of the D type MOS capacitance are short-circuited, and inverse bias is controlled to be applied to a PN junction configured in the source, the drain, and a well.

Although the gate capacitance C1 of the amplifier MOS 3 and the capacitance C2 of the floating diffusion 7 have the voltage dependency, the capacitance C3 of the MOS capacitance is larger than both other capacitances as the capacitance, and as a result, the sensor output voltage for the incident light amount may substantially have linearity in the range of the operating voltage of the pixel.

Figure 5:
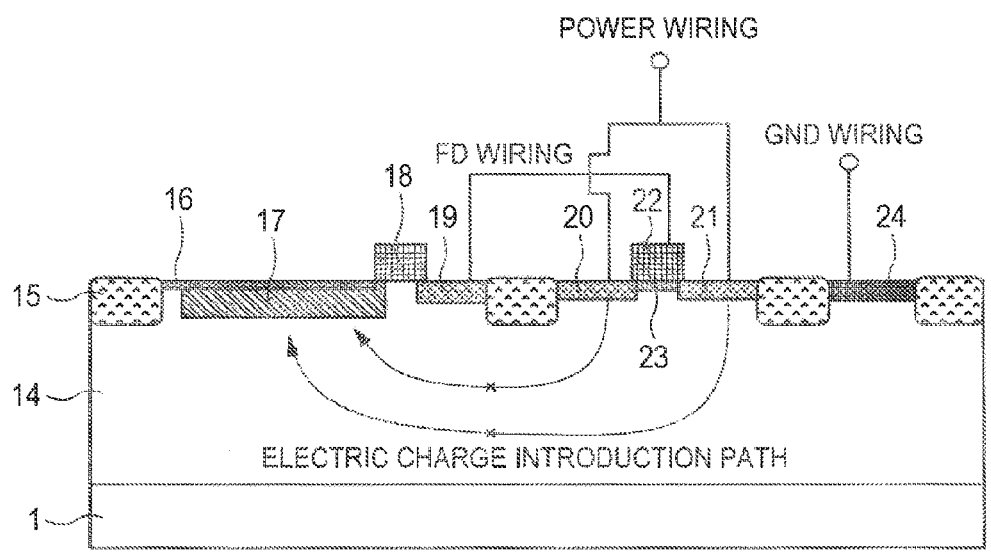
FIG. 5 is a cross-sectional view of primary parts in the first embodiment.

FIG. 5 is a cross-sectional structure of primary parts of the D type MOS capacitance and the PD unit. An element separation region 15 made of an insulator (generally, formed by an oxide film) is formed and a P well 14 is formed by adding a P type impurity, on a semiconductor substrate 1. Subsequently, an impurity to adjust a threshold value of a transistor configuring a pixel circuit is added. As some of a series of processes that add the impurity to adjust the threshold value, an N type impurity 23 having the threshold value of the MOS capacitance as the depression type is added.

As a subsequent process, gate electrodes 18 and 22, and impurity regions 16, 17, 19, 20, 21, and 24 are formed. The gate electrode 18 is a gate of the transfer MOS 1 and the gate electrode 22 is a gate of the D type MOS capacitance 4. The impurity region 17 is an N type photodiode PD and the impurity region 16 is a surface P type protection layer of the photodiode PD. The impurity regions 19, 20, and 21 are $N^+$ diffusion layers, the impurity region 19 is the floating diffusion FD, the impurity region 20 is a source of the D type MOS capacitance 4, the impurity region 21 is a drain of the D type MOS capacitance 4, and the impurity region 24 is a $P^+$ diffusion layer.

As illustrated in FIG. 1, the impurity region 19, and the gate electrode 22 of the D type MOS capacitance 4 and the amplifier MOS are connected to each other, and the electric charge transmitted from the photodiode PD is received, and FD capacitance performing electric charge-to-voltage conversion is configured.

A source 20 and a drain 21 of the D type MOS capacitance 4 are short-circuited, and power voltage is applied. The P well is connected to GND (ground potential). Therefore, the PN junction is formed between the source 20 ($N^+$) and the drain 21 ($N^+$) of the D type MOS capacitance, and the P well 14, and further, the power potential to apply inverse bias to the PN junction is applied to the source 20 and the drain 21 of the D type MOS capacitance, and as a result, a plurality of carriers (electrons) that exists at the source and the drain is excited by heat energy, and is not introduced into the photodiode PD.

Figure 6:
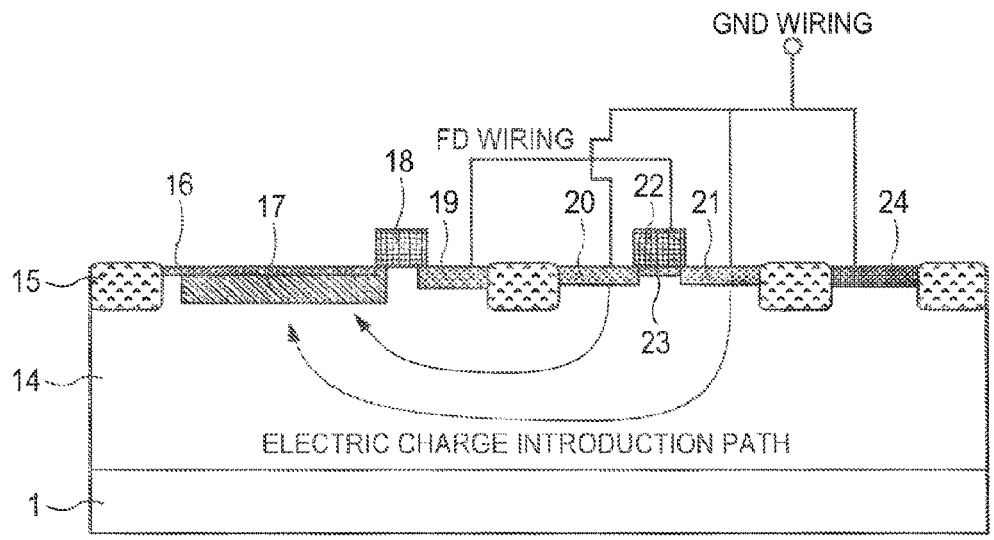
FIG. 6 is a comparative example to FIG. 5.

FIG. 6 illustrates an example of applying the GND (ground potential) to the source and the drain of the D type MOS capacitance as a comparative example. Further, FIG. 6 is the same as FIG. 5 in terms of other points. In this case, the PN junction between the source 20 and the drain 21 of the D type MOS capacitance 4, and the P well 14 is non-bias. As a result, the electron excited by the heat energy at the source 20 and the drain 21 is introduced into the photodiode PD (impurity region 17) through the P well 14 to increase dark current. In this regard, when the structure of FIG. 5 is applied, the dark current is enhanced to 1/10.

In a first embodiment, although the photodiode PD is the N type, the well is the P type, and the configuration of the D type MOS capacitance is the N type, respective conductivity types may be replaced. That is, the photodiode PD, the well, and the configuration of the D type MOS capacitance may be similarly formed as the P type, the N type, and the P type.

Second Embodiment

Figure 7:
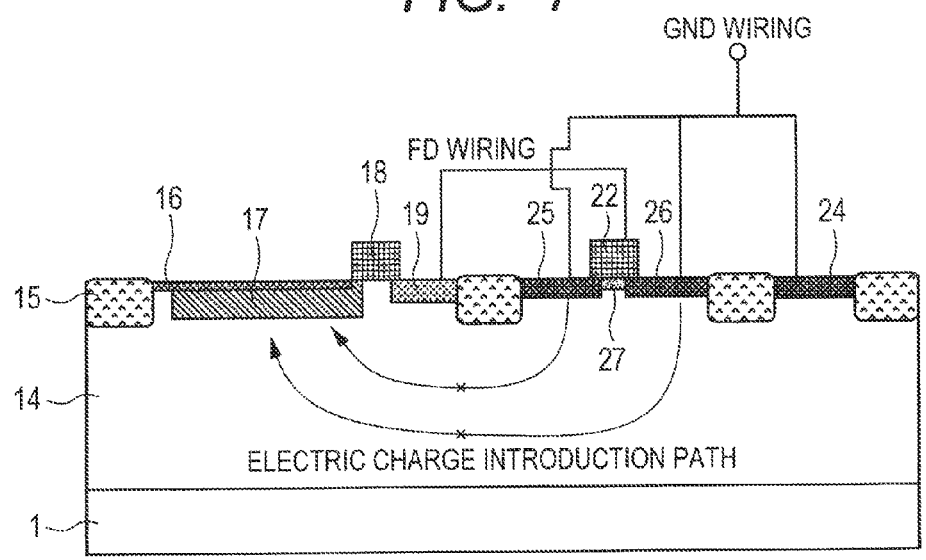
FIG. 7 is a cross-sectional view of primary parts in a second embodiment.

Subsequently, a pixel structure which is a second embodiment will be described. FIG. 7 is a cross-sectional structure of primary parts of the E type MOS capacitance 4 and the PD unit, and FIG. 8 is a circuit diagram of a CMOS image sensor (pixel unit) corresponding to a structure of FIG. 7.

Similarly as the first configuration example, the element separation region 15 made of the insulator (generally, formed by the oxide film) is formed and the P well 14 is formed by adding the P type impurity, on the semiconductor substrate 1. Subsequently, the impurity to adjust a threshold value of the transistor configuring the pixel circuit is added. In some of a series of processes that add the impurity to adjust the threshold value, a P type impurity 27 having the threshold value of the MOS capacitance 4 as the enhancement type is added.

As a subsequent process, the gate electrodes 18 and 22, and the impurity regions 16, 17, 19, 25, 26, and 24 are formed. The gate electrode 18 is the gate of the transfer MOS 1 and the gate electrode 22 is a gate of the E type MOS capacitance 4'. The impurity region 17 is the N type photodiode PD and the impurity region 16 is the surface P type protection layer of the photodiode PD. The impurity region 19 is the N+ diffusion layer. The impurity regions 24, 25, and 26 are the P+ diffusion layers, the impurity region 25 is a source of the E type MOS capacitance 4', and the impurity region 26 is a drain of the E type MOS capacitance 4'.

Figure 8:
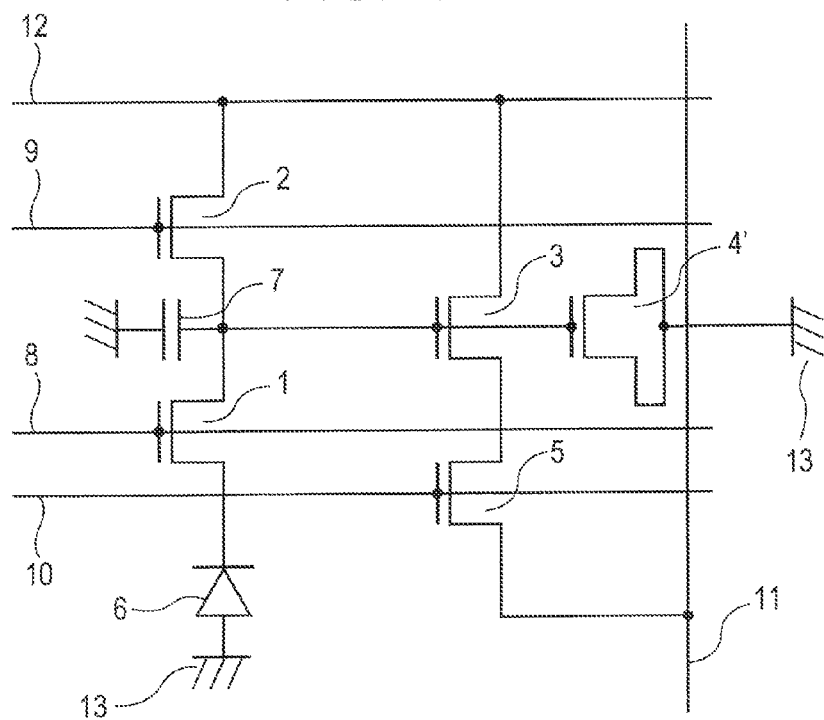
FIG. 8 is a pixel circuit configuration diagram of a solid-state image sensing device in the second embodiment.

As illustrated in FIG. 8, the impurity region 19 (floating diffusion FD), and the gate of the E type MOS capacitance 4' and the amplifier MOS 3 are connected to each other, and the electric charge transmitted from the photodiode PD is received, and FD capacitance performing electric charge-to-voltage conversion is configured.

A source 25 and a drain 26 of the E type MOS capacitance 4' are short-circuited, and the GND voltage (ground voltage) is applied. The P well 14 is connected to the GND voltage (ground potential). The source 25 and the drain 26 constituting the MOS capacitance 4', and a threshold value adjustment layer 27 are all configured as a P type which is similar as the P well, and there is no PN junction between the source 25 and the drain 26, and the P well 14. The electron as the signal charge is a minority carrier in the source 25 and the drain 26, and electric charges generated by heat excitation are minimal. Therefore, there is almost no electric charge that is introduced into the impurity region 19. Even when the structure of FIG. 7 is applied, the dark current is enhanced to ⅒. An operating waveform of FIG. 8 is the same as that of FIG. 2.

Figure 9:
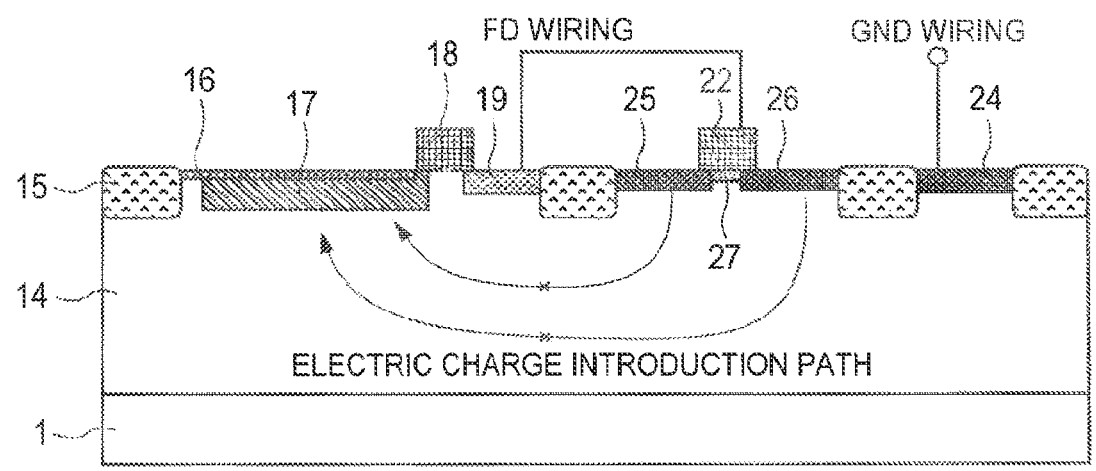
FIG. 9 is a cross-sectional view (modified example) of primary parts in the second embodiment.

In the configuration of FIG. 7, both the source 25 and the drain 26 constituting the E type MOS capacitance have the same conductivity type as the P well 14. FIG. 9 illustrates a modified example for further reducing a layout dimension, and the source 25 and the drain 26 constituting the MOS capacitance 4' are enabled to be short-circuited in the substrate without being short-circuited by a wiring layer. As a result, a layout dimension of the pixels may be reduced.

Therefore, improvement of an SN ratio and extension of a dynamic range may be simultaneously implemented.

What is claimed is:

1. A solid-state image sensing device having a semiconductor integrated circuit (IC), comprising the IC, the IC comprising:
    a P type semiconductor region;
    a N type photodiode formed in at the semiconductor surface P well region; and
    a pixel including an N type floating diffusion accumulating electrons generated by the photodiode and an enhancement type metal-oxide semiconductor (MOS) capacitance, the MOS capacitance being additional capacitance of the floating diffusion, the MOS capacitance being connected to the capacitance of the floating diffusion in parallel electrically,
    wherein the photodiode is made of the first impurity region and the P well region,
    the N type floating diffusion is made of the second impurity region and the P well region,
    the capacitance is made of the third impurity region as a source, the fourth impurity region as a drain, and the P well region,
    a first gate electrode is made between the first impurity region and the second impurity region,
    a second gate electrode is made between the third impurity region and the fourth impurity region;
    the second impurity region and the second gate electrode of the MOS capacitance are connected electrically to each other; and
    wherein during a reset period, a reset line and a read line are high, a reset MOS and a transfer MOS are conducting, and as a result, electric charges of the photodiode and the floating diffusion are reset,
    thereafter, the reset line and the read line are low, and the reset MOS and the transfer MOS are not conducting, and
    wherein during an exposure period, photoelectric charges generated by irradiation of light are accumulated in the photodiode,
    thereafter, the read line is high and the transfer MOS is conductive to transmit the electric charges accumulated in the photodiode to the floating diffusion and the MOS capacitance, the floating diffusion serving as a capacitor, and the floating diffusion and the MOS capacitance accumulating the electric charges depending on a light irradiation level to the photodiode, and
    wherein during a read period, a selection line is high and a select MOS is conducting, a constant current source is connected to an amplifier MOS and constant current flows between a source and a drain of the amplifier MOS, a gate electrode of the amplifier MOS is connected to the floating diffusion and the MOS capacitance such that gate voltage depending on an accumulated charge quantity is applied to the amplifier MOS and a potential depending on the accumulated charge quantity is shown at the source of the amplifier MOS, and output of the amplifier MOS is read to a signal line through the select MOS as pixel information,
    thereafter, the reset period occurs, and
    wherein the MOS capacitance is an enhancement type MOS capacitance having P type source and drain regions and shows a saturation characteristic in a range of operating voltage of the sensing device,
    ground voltage is applied to semiconductor region,
    the P type source and drain regions have the ground voltage applied thereto, and
    the MOS capacitance has threshold voltage higher than an operating voltage of the image sensing device, thereby reducing voltage dependency of the MOS capacitance.

2. A solid-state image sensing device having a semiconductor integrated circuit (IC), comprising the IC, the IC comprising:
    a P type semiconductor region;
    a N type photodiode formed in at the semiconductor surface P well region; and
    a pixel including an N type floating diffusion accumulating electrons generated by the photodiode and an enhancement type metal-oxide semiconductor (MOS) capacitance, the MOS capacitance being additional capacitance of the floating diffusion, the MOS capacitance being connected to the capacitance of the floating diffusion in parallel electrically, wherein the photodiode is made of the first impurity region and the P well region, the N type floating diffusion is made of the second impurity region and the P well region, the capacitance is made of the third impurity region as a source, the fourth impurity region as a drain, and the P well region, a first gate electrode is made between the first impurity region and the second impurity region, a second gate electrode is made between the third impurity region and the fourth impurity region;

the second impurity region and the second gate electrode of the MOS capacitance are connected electrically to each other; and wherein during a reset period, a reset line and a read line are high, a reset MOS and a transfer MOS are conducting, and as a result, electric charges of the photodiode and the floating diffusion are reset, thereafter, the reset line and the read line are low, and the reset MOS and the transfer MOS are not conducting, and wherein during an exposure period, photoelectric charges generated by irradiation of light are accumulated in the photodiode, thereafter, the read line is high and the transfer MOS is conductive to transmit the electric charges accumulated in the photodiode to the floating diffusion and the MOS capacitance, the floating diffusion serving as a capacitor, and the floating diffusion and the MOS capacitance accumulating the electric charges depending on a light irradiation level to the photodiode, and wherein during a read period, a selection line is high and a select MOS is conducting, a constant current source is connected to an amplifier MOS and constant current flows between a source and a drain of the amplifier MOS, a gate electrode of the amplifier MOS is connected to the floating diffusion and the MOS capacitance such that gate voltage depending on an accumulated charge quantity is applied to the amplifier MOS and a potential depending on the accumulated charge quantity is shown at the source of the amplifier MOS, and output of the amplifier MOS is read to a signal line through the select MOS as pixel information, thereafter, the reset period occurs, and wherein the MOS capacitance is an enhancement type MOS capacitance having P type source and drain regions and shows a saturation characteristic in a range of operating voltage of the sensing device, ground voltage is applied to semiconductor region, the P type source and drain regions have the ground voltage applied thereto, the P type source and drain regions of the MOS capacitance are shorted together in a substrate of the IC, and the MOS capacitance has threshold voltage higher than an operating voltage of the image sensing device, thereby reducing voltage dependency of the MOS capacitance.

3. The solid-state image sensing device of claim 1, wherein the P type source and drain regions of the MOS capacitance are shorted together through a conductor external to the semiconductor IC.

* * * * *